United States Patent
Cao et al.

(10) Patent No.: US 10,394,971 B2
(45) Date of Patent: *Aug. 27, 2019

(54) HYBRID SIMULATION OF A COMPUTING SOLUTION IN A CLOUD COMPUTING ENVIRONMENT WITH A SIMPLIFIED COMPUTING SOLUTION AND A SIMULATION MODEL

(71) Applicant: International Business Machines Corporation, Armonk, NY (US)

(72) Inventors: Bin Cao, Rochester, MN (US); Daniel L. Hiebert, Pine Island, MN (US); Brian R. Muras, Otsego, MN (US)

(73) Assignee: International Business Machines Corporation, Armonk, NY (US)

( * ) Notice: Subject to any disclaimer, the term of this patent is extended or adjusted under 35 U.S.C. 154(b) by 399 days.

This patent is subject to a terminal disclaimer.

(21) Appl. No.: 14/730,266

(22) Filed: Jun. 4, 2015

(65) Prior Publication Data

US 2016/0357885 A1 Dec. 8, 2016

(51) Int. Cl.
G06F 17/50 (2006.01)
G06F 9/455 (2018.01)
H04L 12/24 (2006.01)
H04L 29/08 (2006.01)

(52) U.S. Cl.
CPC .......... *G06F 17/5009* (2013.01); *G06F 9/455* (2013.01); *H04L 41/145* (2013.01); *H04L 67/10* (2013.01); *H04L 41/5041* (2013.01); *H04L 41/5096* (2013.01)

(58) Field of Classification Search
CPC .. G06F 17/5009; G06F 9/455; G06F 9/45533; H04L 41/145; H04L 67/10; H04L 41/5041; H04L 41/5096
See application file for complete search history.

(56) References Cited

U.S. PATENT DOCUMENTS

| | | |
|---|---|---|
| 6,898,564 B1 | 5/2005 | Odhner et al. |
| 2012/0290702 A1 | 11/2012 | Vincent |
| 2013/0174124 A1* | 7/2013 | Watters ............... G06F 8/71 717/122 |
| 2013/0247034 A1 | 9/2013 | Messerli |
| 2013/0268643 A1 | 10/2013 | Chang et al. |

OTHER PUBLICATIONS

Antonescu, A. et al., "SLA-Driven Simulation of Multi-Tenant Scalable Cloud-Distributed Enterprise Information Systems" ACM Symposium on Principles of Distributed Computing [online], Jul. 2014 [retrieved Jun. 28, 2017]. Retrieved Online from ResearchGate:<URL: https://www.researchgate.net/publication/263390040><DOI: 10.1007/978-3-319-13464-2_7>.*

(Continued)

*Primary Examiner* — Bijan Mapar
(74) *Attorney, Agent, or Firm* — Martin & Associates, LLC; Bret J. Petersen

(57) ABSTRACT

A simulation mechanism manages deployment of a simplified computing solution (SCS) and a corresponding simulation model that simulates a scaled multiple of the SCS to allow a deployment configuration for a large scale computing solution to be determined and tested before actually deploying the large scale computing solution.

10 Claims, 8 Drawing Sheets

(56) References Cited

OTHER PUBLICATIONS

Buyya, R. et al., "Modeling and Simulation of Scalable Cloud Computing Environments and the CloudSim Toolkit: Challenges and Opportunities" in: Proceedings of the 7th High Performance Computing and Simulation Conference, Jun. 21-24, 2009 [retrieved Jun. 28, 2017]. Retrieved from the Internet: <URL: http://www.cloudbus.org/papers/CloudSim-HPCS2009.pdf>.*

Linkletter, B., Why use a Virtual Machine? Open-Source Routing and Network Simulation [online], Sep. 30, 2012 [retrieved Jun. 29, 2017]. Retrieved from the Internet: <URL: http://www.brianlinkletter.com/why-use-a-virtual-machine/>.*

Tickoo, Omesh, Ravi Iyer, Ramesh Illikkal, and Don Newell. "Modeling virtual machine performance: challenges and approaches." ACM SIGMETRICS Performance Evaluation Review 37, No. 3 (2010): 55-60. (Year: 2010).*

Antonescu, et al., "SLA-Driven Simulation of Multi-Tenant Scalable Cloud-Distributed Enterprise Information Systems" ACM Symposium on Principles of Distributed Computing, Jul. 2014.

Buyya et al., "Modeling and Simulation of Scalable Cloud Computing Environments and the CloudSim Toolkit: Challenges and Opportunities", Proceedings of the 7th High Performance Computing and Simulation Conference, Jun. 21-24, 2009.

Linkletter, Brian, "Why use a Virtual Machine? Open-Source Routing and Network Simulation", retrieved from http://www.brianlinkletter.com/why-use-a-virtual-machine/, Sep. 30, 2012.

Cao et al., "Hybrid Simulation in a Cloud Computing Environment" U.S. Appl. No. 14/740,555, filed Jun. 16, 2015.

List of IBM Patents or Patent Applications Treated as Related.

Tighe, Michael et al., "DCSim—A Data Centre Simulation Tool for Dynamic Virtualized Resource Provisioning", Western University, Canada, Apr. 13, 2012 (24 pages).

"CloudSim: A Framework for Modeling and Simulation of Cloud Computing Infrastructures and Services", Melbourne Clouds Lab, Department of Computer Science and Software Engineering, The University of Melbourne, Australia, available online at http://www,cloudbus.org/cloudsim/, printed Dec. 8, 2014.

Canon, M. D. et al., "A Virtual Machine Emulator for Performance and Evaluation", IP.Com No. 000148804, Jan. 12, 1979.

Anonymous, "Method and apparatus for interfacing execution of cloud management code with a discrete-event simulation for the cloud backend infrastructure", IP.Com No. 000206296, Apr. 18, 2011.

Li. Kangkang et al., "Migration-based Virtual Machine Placement in Cloud Systems", 2013 IEEE 2nd International Conference on Cloud Network (CloudNet), pp. 83-90, 2013.

Das, Krishnadhan, "VirtualCloud—A Cloud Environment Simulator", Department of Computer Science and Engineering, Indian Institute of Technology, Bombay, Oct. 2010.

* cited by examiner

HYBRID SIMULATION OF A COMPUTING SOLUTION IN A CLOUD COMPUTING ENVIRONMENT WITH A SIMPLIFIED COMPUTING SOLUTION AND A SIMULATION MODEL

BACKGROUND

1. Technical Field

This invention generally relates to cloud computing systems, and more specifically relates to hybrid simulation in a cloud computing environment to simulate a large-scale cloud solution on a smaller scale prior to full deployment in the cloud.

2. Background Art

Cloud computing is a common expression for distributed computing over a network and can also be used with reference to network-based services such as Infrastructure as a Service (IaaS). IaaS is a cloud based service that provides physical processing resources to run virtual machines (VMs) as a guest for different customers. The virtual machine may host a user application or a server. A sophisticated user application for a cloud computing environment may be referred to as a large-scale computing solution.

Deployment of a large-scale computing solution to a cloud computing environment it typically a manual and very time-consuming process. Achieving an optimal deployment often requires an iterative process to determine the configuration of the resources needed for the solution, such as how many VMs are needed, the resources needed for each VM, which tasks will run on which VMs, etc. Deployment of the large-scale solution may require significant cloud resources for each of the iterations to optimize the deployment configuration.

BRIEF SUMMARY

An apparatus and method economically simulate a large-scale computing solution in a cloud computing environment. A Simulation Mechanism (SM) manages deployment of a simplified computing solution (SCS) and a corresponding simulation model that simulates a scaled multiple of the SCS to allow a deployment configuration for a large scale computing solution (LSCS) to be determined and tested before actually deploying the LSCS.

The foregoing and other features and advantages of the invention will be apparent from the following more particular description of preferred embodiments of the invention, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

Figure 1:
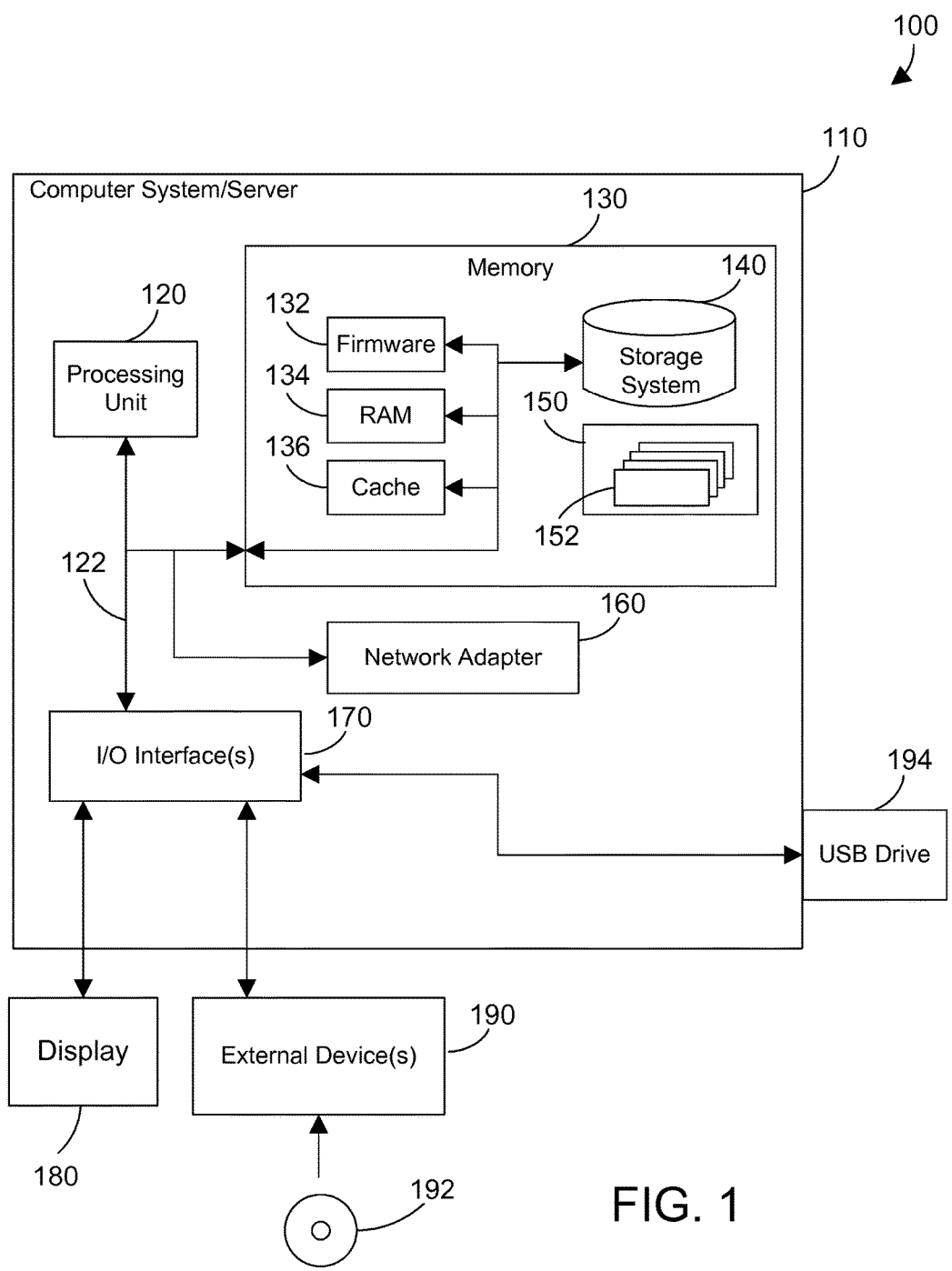
FIG. 1 is a block diagram of a cloud computing node.

The claims and disclosure herein provide mechanisms and methods to economically simulate a large-scale computing solution (LSCS) in a cloud computing environment. A Simulation Mechanism (SM) manages deployment of a simplified computing solution (SCS) and a corresponding simulation model that simulates a scaled multiple of the SCS to allow a deployment configuration for a large scale computing solution (LSCS) to be determined and tested before actually fully deploying the LSCS in the cloud.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a block diagram of an example of a cloud computing node is shown. Cloud computing node 100 is only one example of a suitable cloud computing node and is not intended to suggest any limitation as to the scope of use or functionality of embodiments of the invention described herein. Regardless, cloud computing node 100 is capable of being implemented and/or performing any of the functionality set forth hereinabove.

In cloud computing node 100 there is a computer system/server 110, which is operational with numerous other general purpose or special purpose computing system environments or configurations. Examples of well-known computing systems, environments, and/or configurations that may be suitable for use with computer system/server 110 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 110 may be described in the general context of computer system executable instructions, such as program modules, being executed by a computer system. Generally, program modules may include routines, programs, objects, components, logic, data structures, and so on that perform particular tasks or implement particular abstract data types. Computer system/server 110 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 110 in cloud computing node 100 is shown in the form of a general-purpose computing device. The components of computer system/server 110 may include, but are not limited to, one or more processors or processing units 120, a system memory 130, and a bus 122 that couples various system components including system memory 130 to processor 120.

Bus 122 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 110 typically includes a variety of computer system readable media. Such media may be any available media that is accessible by computer system/server 110, and it includes both volatile and non-volatile media, removable and non-removable media.

System memory 130 can include computer system readable media in the form of volatile, such as random access memory (RAM) 134, and/or cache memory 136. Computer system/server 110 may further include other removable/non-removable, volatile/non-volatile computer system storage media. By way of example only, storage system 140 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 122 by one or more data media interfaces. As will be further depicted and described below, memory 130 may include at least one program product having a set (e.g., at least one) of program modules that are configured to carry out the functions described in more detail below.

Program/utility 150, having a set (at least one) of program modules 152, may be stored in memory 130 by way of example, and not limitation, as well as an operating system, one or more application programs, other program modules, and program data. Each of the operating system, one or more application programs, other program modules, and program data or some combination thereof, may include an implementation of a networking environment. Program modules 152 generally carry out the functions and/or methodologies of embodiments of the invention as described herein.

Computer system/server 110 may also communicate with one or more external devices 190 such as a keyboard, a pointing device, a display 180, a disk drive, etc.; one or more devices that enable a user to interact with computer system/server 110; and/or any devices (e.g., network card, modem, etc.) that enable computer system/server 110 to communicate with one or more other computing devices. Such communication can occur via Input/Output (I/O) interfaces 170. Still yet, computer system/server 110 can communicate with one or more networks such as a local area network (LAN), a general wide area network (WAN), and/or a public network (e.g., the Internet) via network adapter 160. As depicted, network adapter 160 communicates with the other components of computer system/server 110 via bus 122. It should be understood that although not shown, other hardware and/or software components could be used in conjunction with computer system/server 110. Examples, include, but are not limited to: microcode, device drivers, redundant processing units, external disk drive arrays, RAID systems, tape drives, data archival storage systems, etc.

Figure 2:
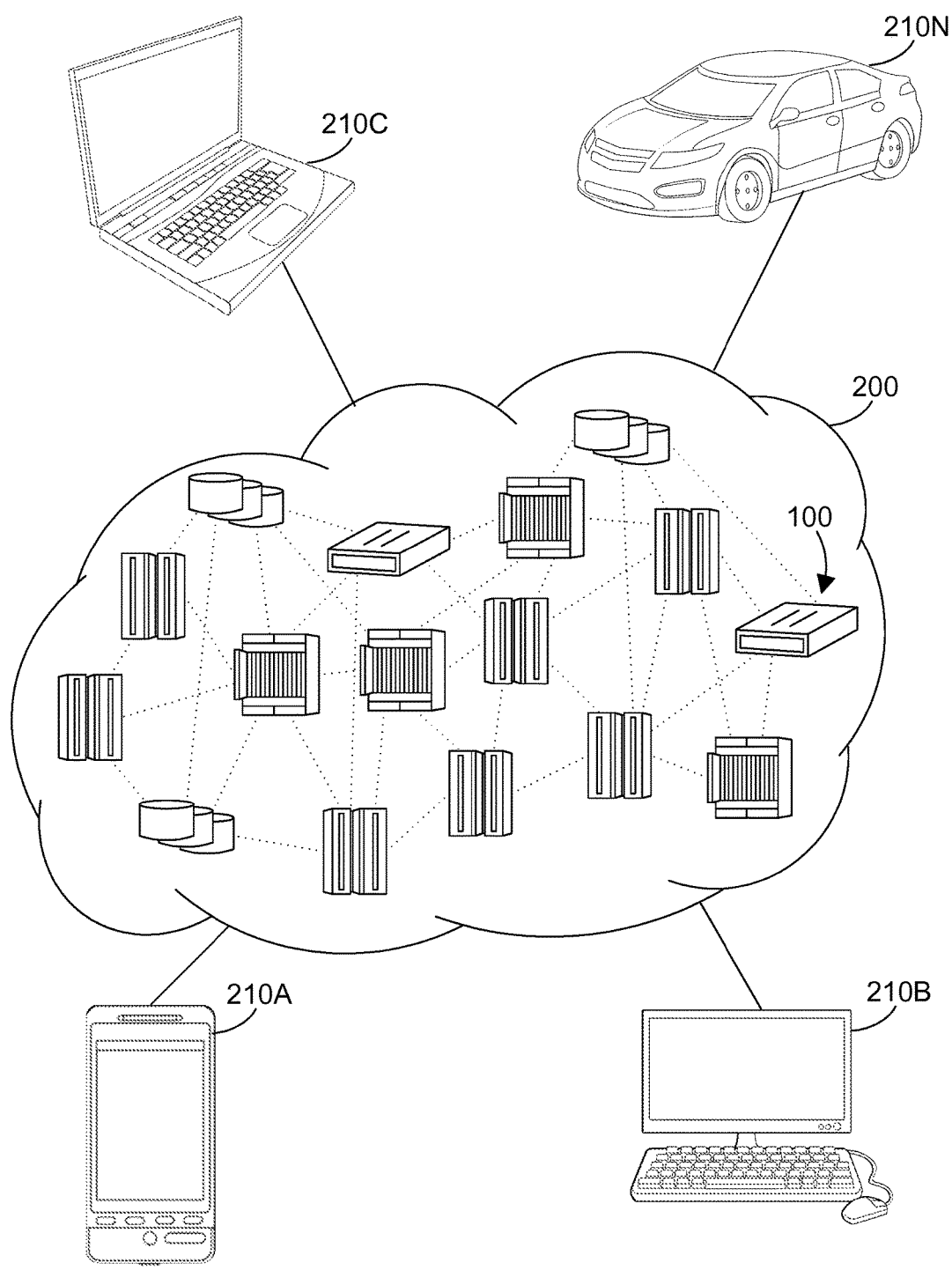
FIG. 2 is a block diagram of a cloud computing environment.

Referring now to FIG. 2, illustrative cloud computing environment 200 is depicted. As shown, cloud computing environment 200 comprises one or more cloud computing nodes 100 with which local computing devices used by cloud consumers, such as, for example, personal digital assistant (PDA) or cellular telephone 210A, desktop computer 210B, laptop computer 210C, and/or automobile computer system 210N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 200 to offer infrastructure, platforms and/or software as services for which a cloud consumer does not need to maintain resources on a local computing device. It is understood that the types of computing devices 210A-N shown in FIG. 2 are intended to be illustrative only and that computing nodes 100 and cloud computing environment 200 can communicate with any type of computerized device over any type of network and/or network addressable connection (e.g., using a web browser).

Figure 3:
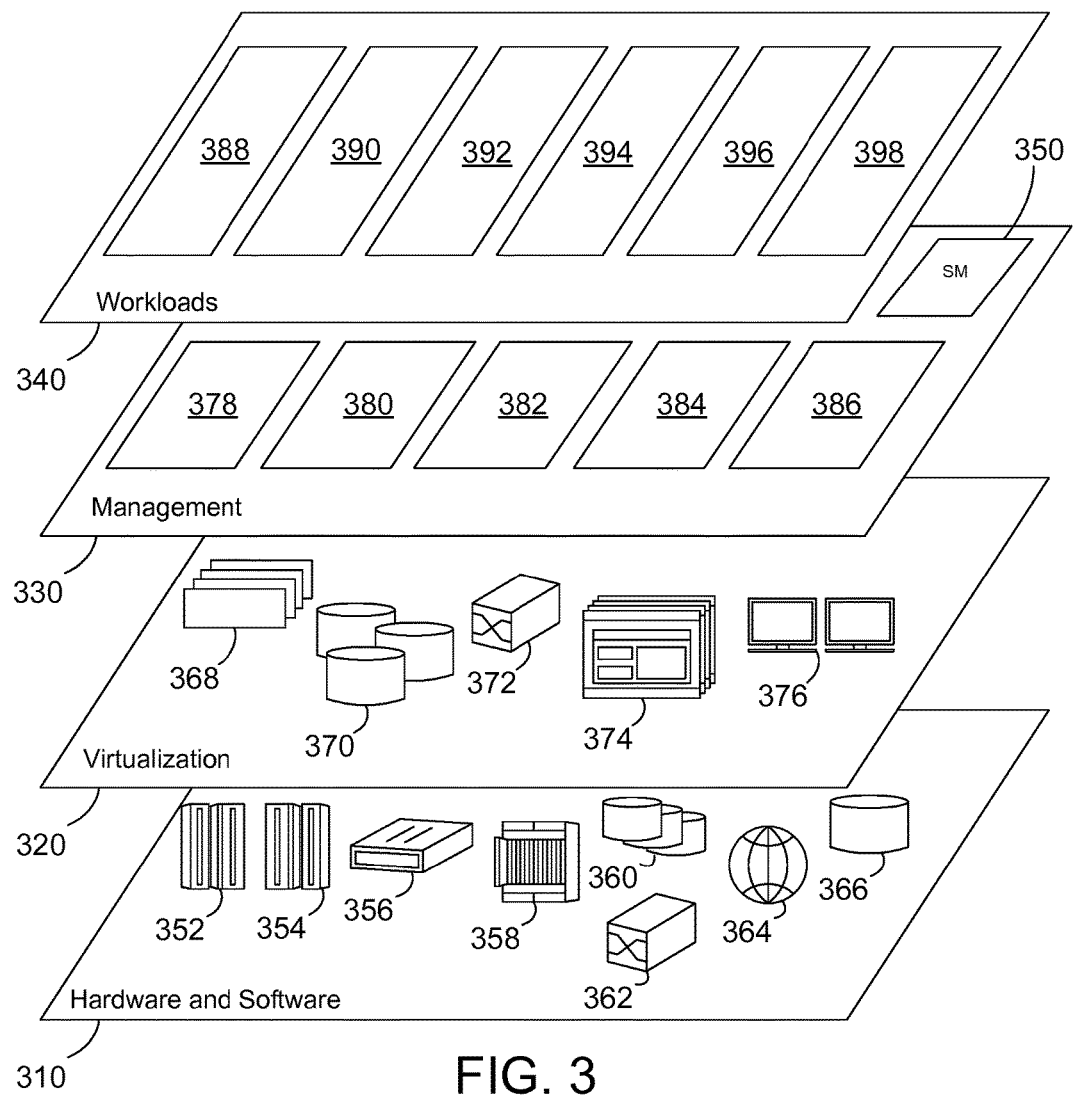
FIG. 3 is a block diagram of abstraction model layers.

Referring now to FIG. 3, a set of functional abstraction layers provided by cloud computing environment 200 (FIG. 2) is shown. It should be understood in advance that the components, layers, and functions shown in FIG. 3 are intended to be illustrative only and the disclosure and claims are not limited thereto. As depicted, the following layers and corresponding functions are provided.

Hardware and software layer 310 includes hardware and software components. Examples of hardware components include mainframes 352; RISC (Reduced Instruction Set Computer) architecture based servers 354; servers 356; blade servers 358; storage devices 360; and networks and networking components 362. In some embodiments, software components include network application server software 364 and database software 366.

Virtualization layer 320 provides an abstraction layer from which the following examples of virtual entities may be provided: virtual servers 368; virtual storage 370; virtual networks 372, including virtual private networks; virtual applications and operating systems 374; and virtual clients 376.

In one example, management layer 330 may provide the functions described below. Resource provisioning 378 provides dynamic procurement of computing resources and other resources that are utilized to perform tasks within the cloud computing environment. Metering and Pricing 380 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 382 provides access to the cloud computing environment for consumers and system administrators. Service level management 384 provides cloud computing resource allocation and management such that required service levels are met. Service Level Agreement (SLA) planning and fulfillment 386 provide pre-arrangement for, and procurement of, cloud computing resources for which a future requirement is anticipated in accordance with an SLA. The management layer further includes a simulation mechanism (SM) 350 as described herein. While the SM 350 is shown in FIG. 3 to reside in the management layer 330, the SM 350 actually may span other levels shown in FIG. 3 as needed.

Workloads layer 340 provides examples of functionality for which the cloud computing environment may be utilized. Examples of workloads and functions which may be provided from this layer include: mapping and navigation 386; software development and lifecycle management 390; virtual classroom education delivery 392; data analytics processing 394; transaction processing 396 and mobile desktop 398.

As will be appreciated by one skilled in the art, aspects of this disclosure may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Figure 4:
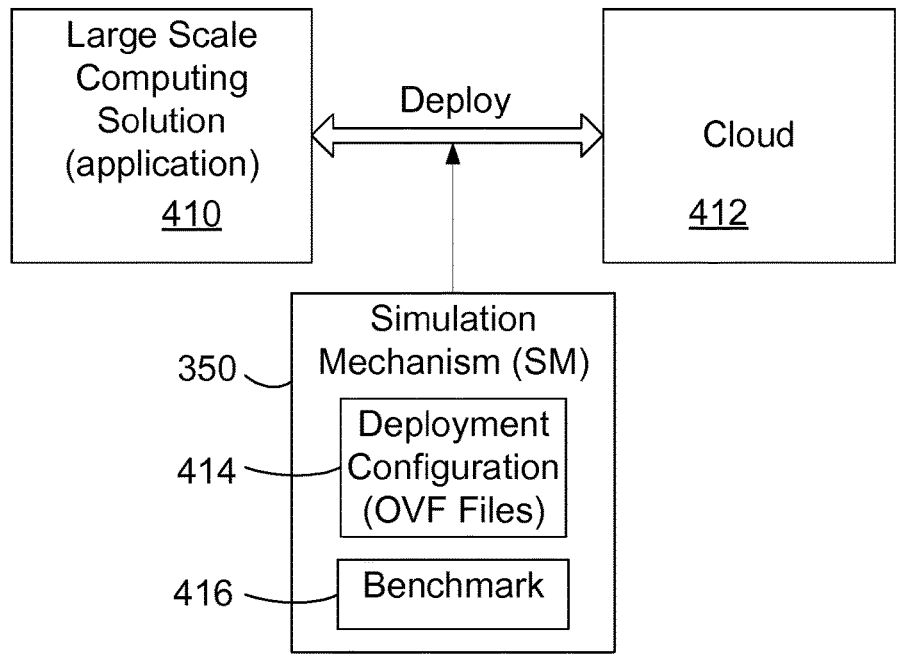
FIG. 4 is a block diagram that illustrates an Simulation Mechanism as described herein that assists in deploying a large scale computing solution.

Referring now to FIG. 4, a block diagram illustrates a large scale computing solution (LSCS) 410 being deployed in the manner described and claimed herein. The LSCS 410 is a customer solution or application that is to be deployed on computer resources such as in a cloud computing environment. The Simulation Mechanism (SM) 350 introduced above with reference to FIG. 3 is employed to economically simulate the LSCS in the cloud 412 and produce a deployment configuration 414 for the LSCS to be deployed into the cloud 412. The LSCS may be minimally deployed or not deployed when EM 350 begins the simulation. The LSCS 410 typically comprises a large and complex set of application processes. In the prior art, deploying the LSCS 410 typically required a manual and time consuming procedure to determine a deployment configuration to deploy the LSCS. In this procedure the administrator/designer was typically required to guess how to initially allocate cloud resources such as virtual machines (VMs), processors, memory and network resources to the various elements of the LSCS. As described herein, the SM 350 assists in the administrator to economically and efficiently deploy the LSCS 410 to the cloud 412. As described further below, the SM 350 manages creation and deployment of a simplified computing solution (SCS) and a corresponding simulation model that simulates a scaled multiple of the SCS to allow the deployment configuration 414 for the LSCS to be determined and tested before actually deploying the LSCS in the cloud.

Again referring to FIG. 4, the SM 350 in the illustrated example includes a deployment configuration 414 and a benchmark 416. The deployment configuration 414 represents configuration information necessary for the SM 350 to deploy the LSCS 410 to the cloud. The deployment configuration may include one or more open virtualization format (OVF) descriptor or files. OVF is an industry standard for packaging and distributing virtual machines. In the example described herein, the deployment configuration when completed may include an OVF file for each component of the LSCS as described further below. The benchmark 416 represent one or more benchmark processes and metrics used to determine if the deployment meets acceptable performance standards as described further below.

Figure 5:
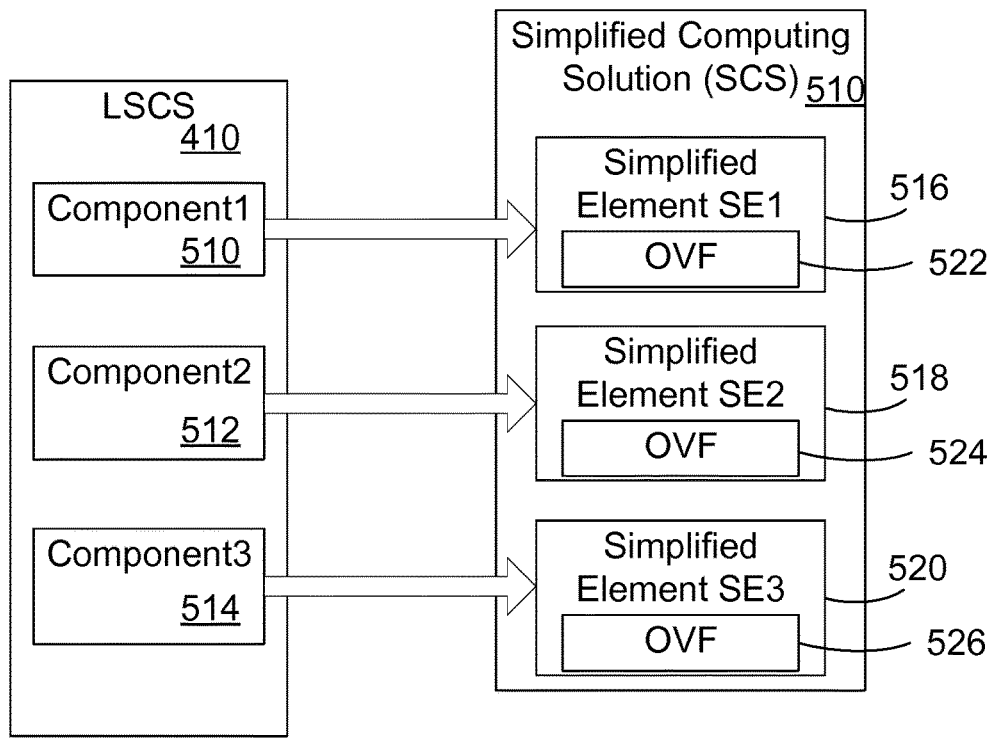
FIG. 5 is a block diagram that illustrates a simplified computing solution as described herein.

Referring now to FIG. 5, a block diagram illustrates the LSCS 410 and a simplified computing solution (SCS) 510 corresponding to the LSCS 410. In this example, the LSCS 410 has three components, component1 510, component2 512 and component3 514. The three components 510, 512 and 514 represent portions of the application or large scale computing solution. Three components are used herein for example only. It is understood that in practice, the LSCS 410 could be divided into any number of components. The SCS 510 is a simplified version of the large scale computing solution (LSCS) 410. The SCS 510 may be realized as a special version of the LSCS. The SCS is also divided into elements. In this example, the SCS has three simplified elements SE1 516, SE2 518 and SE3 520 corresponding to the three elements of the LSCS. The simplified elements 516, 518 and 520 are each a portion of the SCS that may each deployed on one or more VMs (not shown) in the cloud 412.

Again referring to the example illustrated in FIG. 5, the simplified elements 516, 518 and 520 each have an open virtualization format (OVF) descriptor or file 522, 524, 526. OVF is an industry standard for packaging and distributing virtual machines. The OVF files 522, 524, 526 in this example contain information for packaging and deploying the corresponding components of the LSCS 410. The OVF files are created by the SM and modified and updated as described further below. The OVF files 522, 524, 526 may include the network resources, disk resources, memory resources, operating system resources, and computer processor resources allocated to each of the LSCS components. For example, the network resources may include internet protocol (IP) setup information and the version or type of internet protocol needed (IPV4 or IPV6). The CPU resources may include the number of physical CPUs assigned to the corresponding component. In the illustrated example, the OVF files are shown residing in the elements of the SCS for reference only to show their association with the SCS. The location of the OVF files may actually reside in any location accessible to the SM 350 such as in the deployment configuration 414 shown in FIG. 4.

Figure 6:
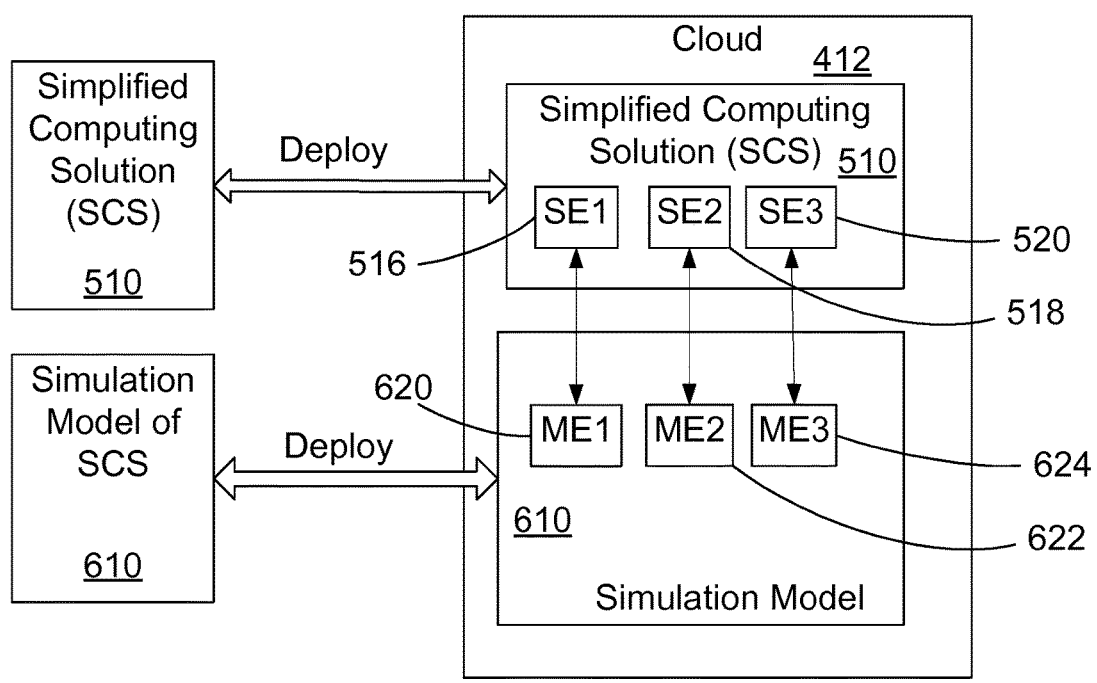
FIG. 6 is a block diagram that illustrates deployment of the simplified computing solution and the simulation model as described herein.

Referring now to FIG. 6, a block diagram illustrates simulation of a computing solution or application as claimed herein. A simplified computing solution (SCS) 510 as described above is deployed in a cloud computing environment 412 by the Simulation Mechanism (SM) 350 shown in FIG. 4. Similarly, the SM 350 deploys a simulation model 610 of the SCS 510 to the cloud 412. The SCS is divided into one or more elements as described above. In the illustrated example, the SCS 510 has three elements SE1 516, SE2 518 and SE3 520. Similarly, in this example the simulation model 610 is provided with a corresponding simulation model element for each element of the SCS 510. In the illustrated example, the simulation model 610 has simulation model elements ME1 620, ME2 622 and ME3 624. The simulation model 610 may be deployed as a single virtual machine (VM). In this example, each of the elements of the simulation model ME1 620, ME2 622 and ME3 524 is a process that simulates the load of the corresponding element of the SCS, where simulating the load means using a proportionate amount of cloud resources as used by the corresponding element of the SCS.

Again referring to FIG. 6, the simulation model 610 with the corresponding simulation elements is also deployed to the cloud. The simulation model 610 is used to scale up the SCS 510. Initially, the simulation model 620 has a single element for each element of the SCS. In the illustrated example, the SCS 510 has three elements as described above. The simulation model 610 has a corresponding simulation model element for each element of the SCS. In the illustrated example, the simulation model 610 has simulation model elements ME1 620, ME2 622 and ME3 624. In this example, each of the elements of the simulation model ME1 620, ME2 622 and ME3 624 is a process that simulates the load of the corresponding element of the SCS. The simulation model can be scaled up to simulate loading on cloud resources. The performance of the simulation model 610 may be compared with the performance of the SCS portion of the solution running in the cloud and adjustments made to the simulation model to more accurately reflect run-time data from the solution running in the cloud.

Figure 7:
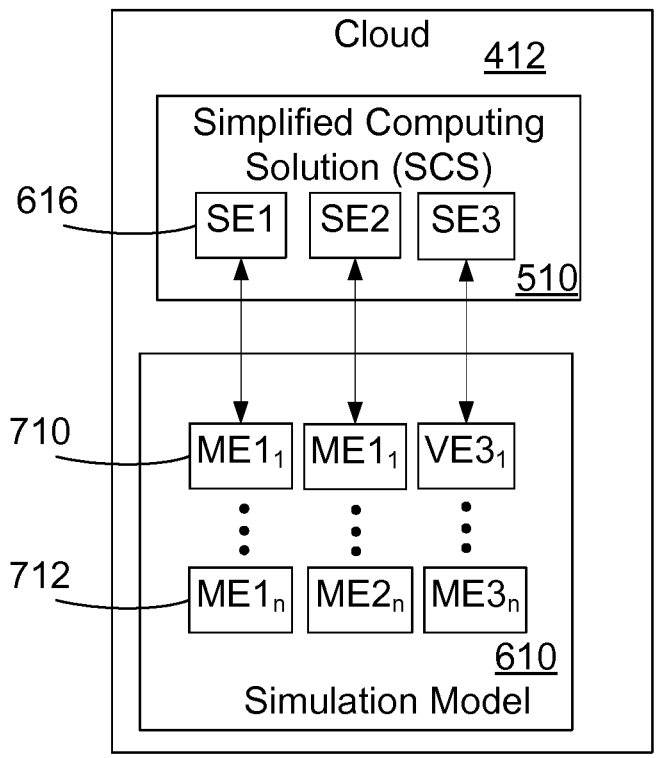
FIG. 7 is a block diagram that illustrates scaling up the simulation model as described herein.

Referring now to FIG. 7, a block diagram illustrates the SM 350 scaling up the simulation model in the cloud in conjunction with the simplified computing solution 510. In the illustrated example, the simulation model 610 is scaled up by replicating each of the simulation model elements. In this example, the elements are scaled up "n" times to represent a scaling factor of "n" by adding additional elements n-1 for each simulation model element. For example, the simulation model element ME1 620 in FIG. 6 is now represented by simulation model elements $ME1_1$ 710 through $ME1_n$ 712. The other simulation model elements are similarly replicated.

Referring again to FIG. 7, the simulation model may be scaled up by steps to a target scale. The target scale may be predetermined or set by a user. The target size is the size of the LSCS to be deployed. The target may come from the documentation or parameters of the LSCS application or and set by the user. For example, the application parameters may call for 10 users per virtual machine and the customer of the application has 5000 users. Then the target would scale up to 500 virtual machines. The simulation model may be scaled up by steps to the target scale, or alternatively, the simulation model may be scaled up to the target in a single step. The steps may be controlled by the user or the steps determined by the SM 350. At each step as the simulation model is scaled up, benchmarks can be run to determine if the system configuration can adequately handle the loads. The "benchmarks" as used herein may include software tests and performance parameters to test the system performance. In addition, the benchmark tests may include monitoring system performance using other performance parameters available in the system. As the SM 350 scales up the simulation model, the SM monitors performance and adjusts the configuration of the simulation. Adjustment of the configuration may include modifying the OVF files described above with reference to FIG. 5.

We will now consider an example of scaling up the simulation model. First, the SM looks to the current real cloud setup and determines a target scale. For example, the target scale may be 100:1 where 100 G of memory is used in the real cloud is reduced to 1 G for the simulation. Thus, the 100 G memory of the real cloud environment is mapped to a 1 G application that is launched within the simulation model on a small VM. The SM 350 will adjust the simulation model to the 100 G real cloud behavior and adjust the OVF files that are needed to make the simulation environment into a real cloud. The simulation models are adjusted in steps to the target size. The steps may be any fractional size of the target size. As the simulation is adjusted, the performance is monitored to determine if the system can handle the workload. If it can, then the change is committed to the SCS and the OVF files are adjusted. For example, the OVF files may be adjusted to give 8 G of memory for each VM instead of 4 G of memory.

Figure 8:
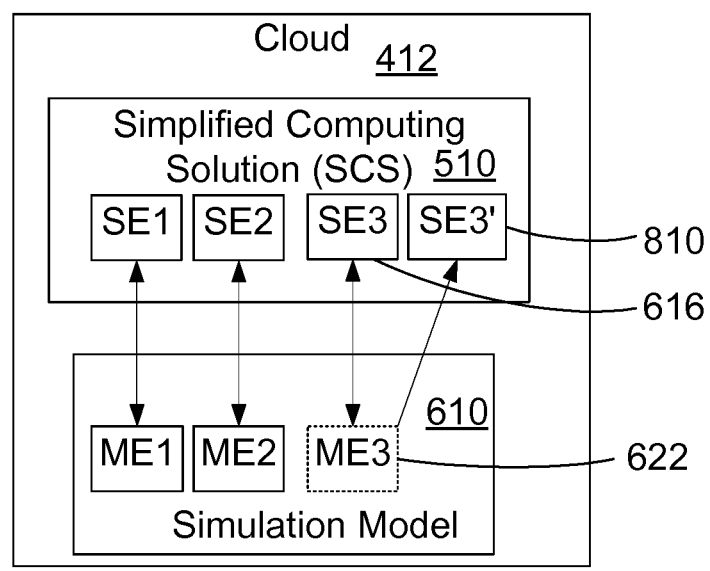
FIG. 8 is a block diagram that illustrates translating a simulation model element to the simplified computing solution as described herein.

Referring now to FIG. 8, a block diagram illustrates an element of the simulation model being swapped into the real portion or non-simulated portion of the cloud to become part of the SCS. In this example, model element ME3 622 is swapped from the simulation model 610 to the simplified computing solution 510. The model element ME3 622 becomes a duplicate 810 of the simplified element 3 (shown as SE3' 810 in FIG. 8). Swapping elements between the simulation model 610 and the SCS 510 allows portions of the solution to be run and tested in the physical cloud for a period time to test deployment of that portion of the solution corresponding to the model element swapped. In this way, any portion of the simulation model can be tested prior to deployment of the large-scale computing solution to the cloud.

Figure 9:
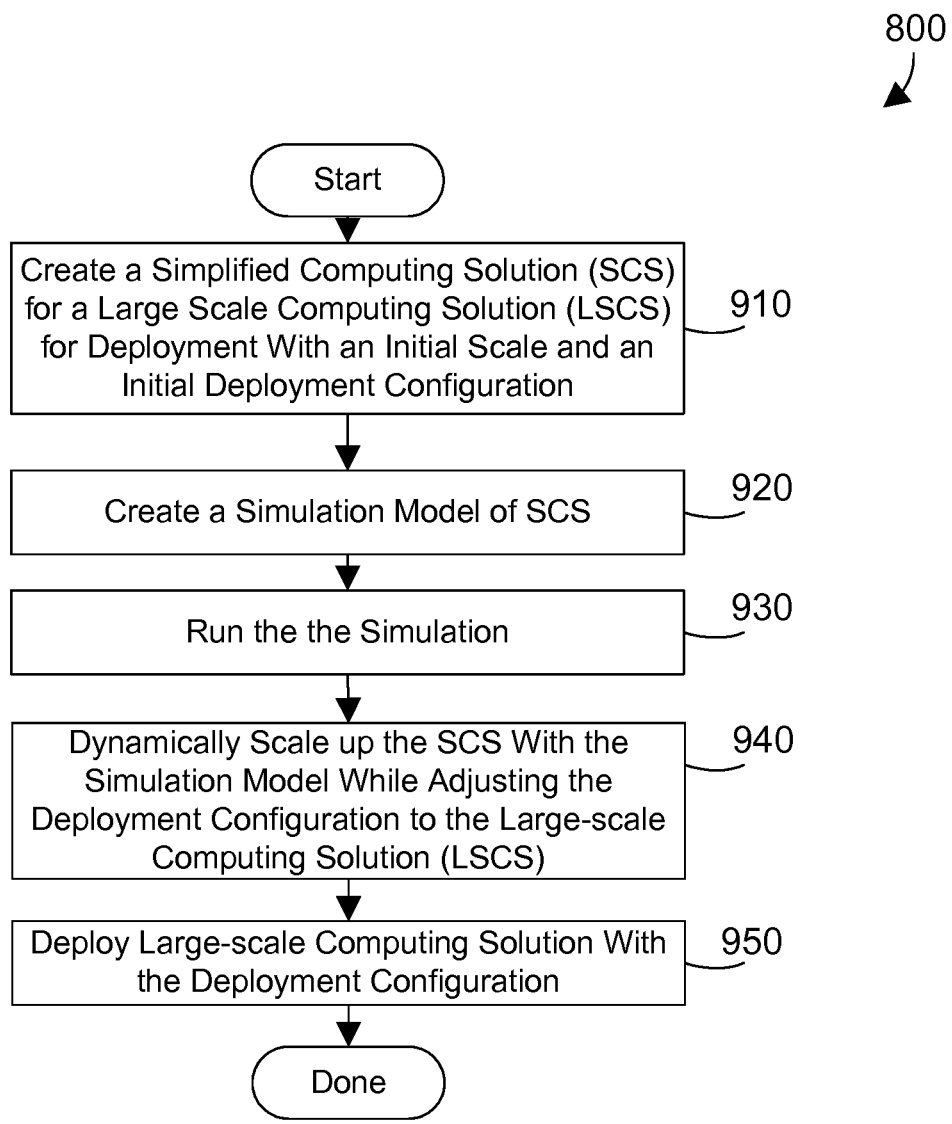
FIG. 9 is a flow diagram of a method for deployment of a large scale computing solution as described herein.

FIG. 9 illustrates a flow diagram of a method 900 for managing deployment of a simplified computing solution and a corresponding simulation model to determine a deployment configuration for a large scale computing solution to be deployed in a cloud. The method 800 is presented as a series of steps performed by a computer software program such as the Simulation Mechanism 350 described above. First, create a simplified computing solution (SCS) corresponding to a large scale computing solution (LSCS) for deployment with an initial scale and an initial deployment configuration (step 910). Create a simulation model of the SCS (step 920). Run the simulation model (step 930). Dynamically scale up the SCS using the simulation model while adjusting the deployment configuration to a scale equivalent to the LSCS (step 940). Deploy the LSCS with the adjusted deployment configuration (step 950). The method is then done.

Figure 10:
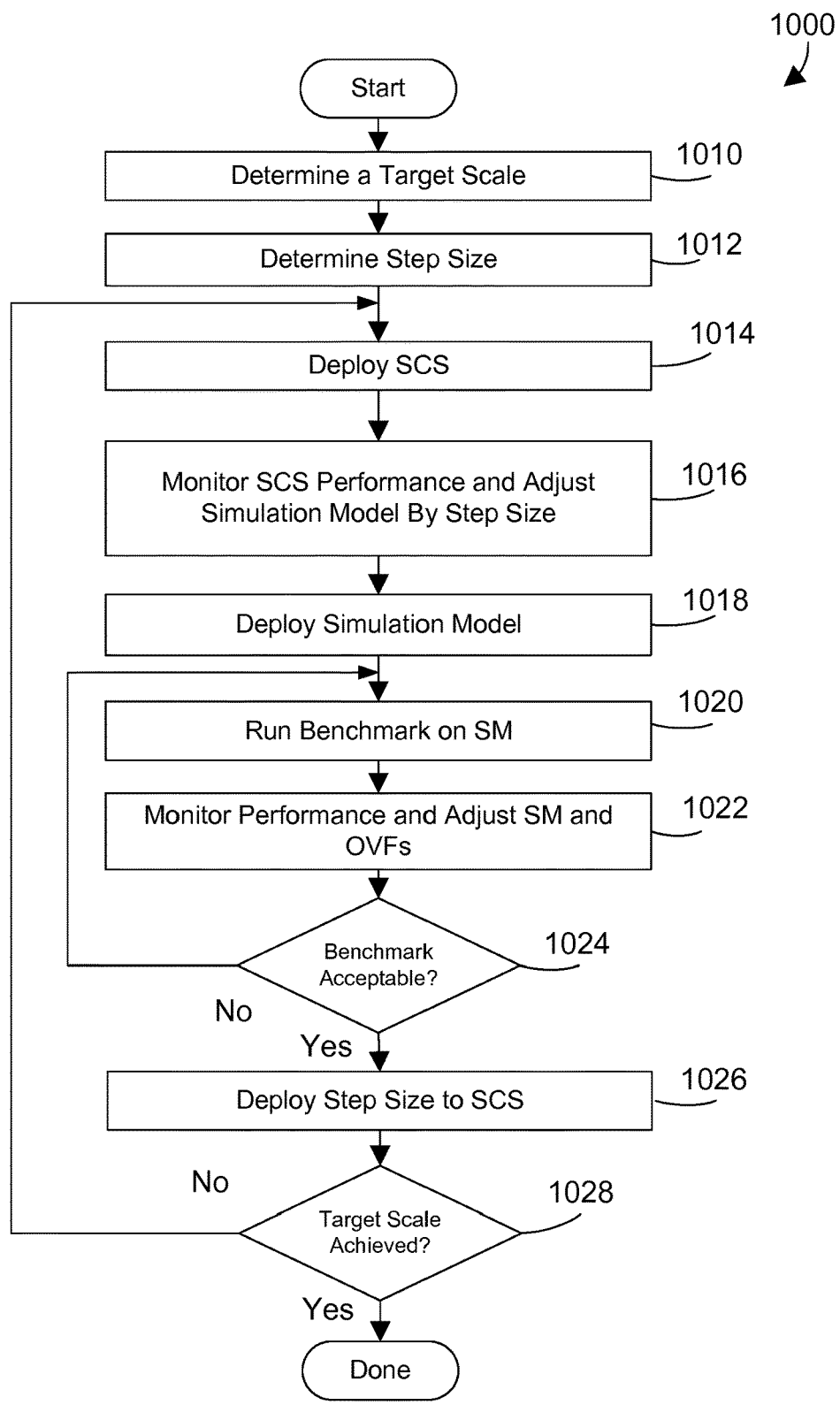
FIG. 10 is a flow diagram of an example method for step 940 in FIG. 9.

Referring now to FIG. 10, a flow diagram shows method 1000 that is an exemplary method for performing step 940 in method 900. The method 1000 is presented as a series of steps performed by a computer software program such as the Simulation Mechanism 350 described above. First, determine a target size (step 1010), then determine a step size (step 1020). Deploy the SCS (step 1014). While monitoring the SCS performance, adjust the simulation model by the step size (step 1016). Deploy the simulation model (step 1018). Run benchmark tests on the simulation model (step 1020). Monitor performance of the cloud resources and adjust the simulation model and OVF files (step 1022). If the benchmark test is not satisfactory (step 1024=no) then return to step 1020. If the benchmark test is satisfactory (step 1024=yes) then deploy the step size to the SCS (step 1026). If the target scale is not achieved (step 1028=no) then return to step 1014. If the target scale is achieved (step 1028=yes) then the method is done.

The claims and disclosure herein provide an apparatus and method for deployment of a simplified computing solution (SCS) and a corresponding simulation model to determine an economical deployment configuration for a large scale computing solution (LSCS) before actually deploying the LSCS in the cloud.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A computer-implemented method for simulation of a large scale computing solution to determine and test deployment of the large scale computing solution before full deployment, the method comprising:
creating a computing solution for deployment on a physical system of computer resources with an initial state of a deployment configuration, where the computing solution is a special version of the large scale computing solution and has an element corresponding to each component of the large scale computing solution and each element includes at least one open virtualization format (OVF) file;
creating a simulation model corresponding to the computing solution wherein the simulation model includes a plurality of model elements, each of the plurality of model elements corresponding to one of each element of the computing solution that simulates a load on the system for the corresponding element;
running a simulation;
running a hybrid simulation by directly deploying both the computing solution and the simulation model together to the physical system of computer resources;
dynamically scaling up the computing solution with the simulation model by steps while running benchmark tests at each step, monitoring system performance of the physical system deploying the computing solution while running the benchmark tests and adjusting the deployment configuration; and
deploying the large scale computing solution with the adjusted deployment configuration determined by scaling up the simulation model.

2. The method of claim 1 wherein the step of dynamically scaling up the computing solution with the simulation model further comprises:
monitoring performance of the computing solution and adjusting the simulation model to make an adjusted simulation model;
deploying the simulation model;
running the benchmark tests on the adjusted simulation model;
where the benchmark tests are within performance parameters deploying the adjusted simulation model to the computing solution.

3. The method of claim 1 wherein the large scale computing solution is deployed to a cloud computing environment.

4. The method of claim 1 wherein the at least one OVF file comprises network resources, disk resources, memory resources, operating system resources, and computer processor resources allocated to components of the computing solution.

5. The method of claim 4 wherein the computer processor resources include a number of physical computer processing units assigned to a corresponding component.

6. The method of claim 1 wherein the step of dynamically scaling up the computing solution with the simulation model further comprises:
determining a target scale, wherein the target scale represents the scale or ratio of the large scale computing solution to be deployed and the simulation model;
determining a step size;
deploying the computing solution;
monitoring the computing solution;
adjusting the simulation model by the step size;
deploying the simulation model;
running a benchmark on the simulation model;
where the benchmark is not within performance parameters then return to the step of adjusting the simulation model by the step size;
where the benchmark is within performance parameters deploy the step size to the computing solution;
where the target size is not achieved then return to the step of adjusting the simulation model by the step size.

7. A computer-implemented method for simulation of a large scale computing solution to determine and test deployment of the large scale computing solution before full deployment, the method comprising:
creating a computing solution for deployment on a physical system of computer resources with an initial state of a deployment configuration, where the computing solution is a special version of the large scale computing solution and has an element corresponding to each component of the large scale computing solution and each element includes at least one open virtualization format (OVF) file;

creating a simulation model corresponding to the computing solution wherein the simulation model includes a plurality of model elements, each of the plurality of model elements corresponding to one of each element of the computing solution that simulates a load on the system for the corresponding element;

running a hybrid simulation by deploying both the computing solution and the simulation model together to the physical system of computer resources;

dynamically scaling up the computing solution with the simulation model by steps while running benchmark tests at each step, monitoring system performance of the system deploying the computing solution while running the benchmark tests and adjusting the deployment configuration; and deploying the large scale computing solution with the adjusted deployment configuration determined by scaling up the simulation model;

wherein dynamically scaling up the simplified computing solution with the simulation model comprises:

determining a target scale, wherein the target scale represents the scale or ratio of the large scale computing solution to be deployed and the simulation model;

determining a step size;

deploying the simplified computing solution to the physical system of computer resources;

monitoring the simplified computing solution and adjusting the simulation model by the step size;

deploying the simulation model;

running a benchmark on the simulation model;

where the benchmark is not within performance parameters then return to the step of adjusting the simulation model;

where the benchmark is within performance parameters deploy the step size to the computing solution;

where the target size is not achieved then return to the step of adjusting the simulation model by a step size.

8. The method of claim 7 wherein the OVF file comprises network resources, disk resources, memory resources, operating system resources, and computer processor resources allocated to components of the computing solution.

9. The method of claim 8 wherein the computer resources are in a cloud computing environment.

10. The method of claim 8 wherein the computer processor resources include a number of physical computer processing units assigned to a corresponding component.

\* \* \* \* \*